United States Patent [19]

Widlar

[11] Patent Number: 4,573,021
[45] Date of Patent: Feb. 25, 1986

[54] CIRCUIT OUTPUT STAGE ARRANGEMENT

[76] Inventor: Robert J. Widlar, Apartado Postal 541, Puerto Vallarta, Jalisco, Mexico

[21] Appl. No.: 592,150

[22] Filed: Mar. 22, 1984

[51] Int. Cl.$^4$ .............................................. H03F 3/26
[52] U.S. Cl. .................................. 330/273; 330/288; 330/296
[58] Field of Search ................ 330/262, 273, 288, 296

[56] References Cited

U.S. PATENT DOCUMENTS

| | | | |
|---|---|---|---|
| 2,896,029 | 7/1959 | Lin | 179/171 |
| 3,863,169 | 1/1975 | Knight | 330/22 |
| 3,974,456 | 8/1976 | Russell et al. | 330/330 |

OTHER PUBLICATIONS

R. K. Oswald; Class B–Emitter–Follower, IBM Technical Disclosure Bulletin, vol. 8, No. 10, Mar. 1966.
"Ion–Implanted JFET–Bipolar Monolithic Analog Circuits", by Russell and Culmer, 2/14/74, 1974, IEE International Solid–State Circuits Conference.
"Integrated Circuits for Accurate Linear Analogue Electric Signal Processing", by J. H. Huijsing, Deflt University Press, 1981.

Primary Examiner—James B. Mullins
Assistant Examiner—G. Wan

[57] ABSTRACT

A circuit arrangement including first and second output transistors, a sensor diode means, and a circuit means. The first output transistor drives the load positive. The second output transistor drives the load negative. The sensor diode means senses the current in the collector of the first output transistor. The circuit means is connected in circuit with the sensor diode means and the base of the second output transistor for establishing the quiescent current level of the first output transistor. An output of the circuit means is applied at the base of the second output transistor for preventing the output of the first output transistor from falling substantially below its quiescent current level. The output of the circuit means is dependent upon the current sensed by the sensor diode means.

29 Claims, 5 Drawing Figures

CIRCUIT OUTPUT STAGE ARRANGEMENT

The present invention relates generally to output stages for integrated circuits, and more particularly to an improved power amplifier output stage arrangement.

Figure 1:
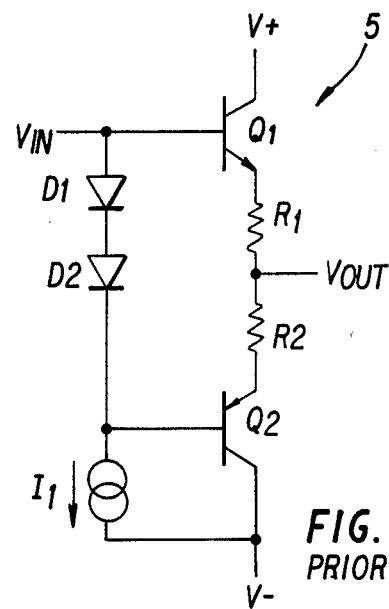

Many linear integrated circuits include a power amplifier at the output stage. A power amplifier stage representative of the prior art is illustrated in FIG. 1. This arrangement, which is generally indicated by the reference numeral 5, is a NPN/PNP complementary amplifier output stage. As is known, this arrangement may be used as a conventional class AB output stage which amplifies the output of a previous stage or stages of a linear circuit.

Amplifier 5 includes a NPN transistor Q1 and a PNP transistor Q2. The two transistors are connected in series between the voltages V+ and V−. A current source $I_1$ supplies the base current to transistor Q2. Because of the complementary characteristics of transistors Q1 and Q2, amplifier stage 5 produces the results of a push-pull amplifier without an inverting circuit.

Diodes D1 and D2 are used to bias the output transistors Q1 and Q2 at their threshold of conduction. Diodes D1 and D2 are also used to prevent a condition known as thermal runaway. This condition is caused by a constantly increasing thermal feedback. As the temperature in the transistors increase, their turn-on threshold decreases which causes the current in them to increase. This increase in current causes the temperature in the transistors to rise even higher. If not prevented, thermal runaway would eventually destroy the transistors.

To avoid thermal runaway, there must be tight thermal coupling between transistors Q1 and Q2, and diodes D1 and D2. To this end, diodes D1 and D2 are placed in close proximity to the transistors and have temperature characteristics that closely match those of the transistors. When the diodes sense the rising temperatures, their forward voltage drop decreases. The decreased voltage across the diodes reduces the voltage difference between the transistor bases, causing less base current to flow and stabilizing the current flow through the transistors. In practice, however, it is not always possible to achieve adequate thermal coupling between the diodes and output transistors so as to prevent thermal runaway.

As shown in FIG. 1, emitter resistors R1 and R2 may also be provided to mitigate the problem of thermal runaway. However, this is done at the expense of output voltage swing where there is a large voltage drop across resistors R1 and R2.

An additional problem associated with the use of a complementary amplifier in linear integrated circuits is the difficulty of matching the characteristics of NPN/PNP transistors Q1 and Q2. That is to say, it is usually difficult to fabricate suitable PNP and NPN transistors having truly complementary characteristics.

A potential problem in Class AB amplifiers, whether or not a complementary or a quasi-complementary amplifier, is the existence of crossover distortion. Crossover distortion occurs when the Class A current of the circuit is too low, causing it to effectively run Class B.

The circuit arrangement of the present invention is designed to overcome the above-discussed problems. This circuit arrangement is particularly suitable for use as an integrated circuit output buffer. Buffers may be used to increase the output swing of an operational amplifier, eliminate ringing with large capacitive loads, and improve the performance of high speed followers, integrators and sample/hold circuits.

Heretofore interest in buffers has been low because a reasonably priced, high performance, general purpose buffer has not been available. Ideally, a buffer should be fast, have no crossover distortion and drive a lot of currrent with a large output swing. At the same time, the buffer should not use much power, be able to drive all capacitive loads without stability problems and cost about the same as the operational amplifiers it is used with. Current limiting and thermal overload protection are also desirable.

The circuit arrangement of the present invention meets these goals. A truly general purpose buffer is provided that is faster than most operational amplifiers but also useable in slow applications.

In view of the foregoing, an object of the present invention is to provide an improved power amplifier stage arrangement.

Another object of the present invention is to provide an improved power amplifier output stage wherein the problems of thermal runaway and crossover distortion are substantially eliminated.

Yet another object of the present invention is to provide an improved output stage arrangement for a linear integrated circuit wherein there is no need to have complementary NPN/PNP power output transistors.

A still further object of the present invention is to provide a high performance, general purpose output buffer.

As will be described in more detail hereinafter, the circuit arrangement of the present invention is especially suitable for use with linear integrated circuits. The design of the present invention, however, is not limited to use with integrated circuits. It may also be used with circuits involving discrete or individual components. The circuit design of the present invention offers a new and improved power amplifier output stage for the previous stage or stages of a larger circuit.

The circuit design of the present invention comprises first and second output transistors. The collector of the second output transistor is connected to the emitter of the first output transistor. The input to the circuit is applied to the base of the first output transistor. The output is taken from the junction of the collector of the second output transistor and the emitter of the first output transistor. The first output transistor supplies the positive output load current, and the second output transistor supplies the negative output load current.

The circuit further includes a first diode means for sensing the current flow in the collector of the first output transistor. In addition, the circuit includes a circuit means connected in circuit with the first diode means and the base of the second output transistor. The circuit means is utilized to establish the quiescent current level of the first output transistor. The circuit means also has an output that may be applied to the base of the second output transistor for preventing the output of the first output transistor from falling substantially below its quiescent current level. The output of the circuit means is dependent upon the current sensed by the first diode means.

The essential elements of the circuit design of the present invention are the first and second output transistors, the first diode means, and the circuit means which functions as described above. The circuit means may comprise any elements appropriately connected in circuit to provide the prescribed functions.

The circuit means may include a second diode means, a current source and an operational amplifier. The current source, having a known value, is connected in circuit with the second diode means to estabish a reference voltage thereacross. The current source in conjunction with the first and second diode means determines the quiescent current level of the first output transistor. The operational amplifier is connected in circuit with the first and second diode means, and the first and second output transistors. The operational amplifier compares the reference voltage to voltage across the first diode means. The voltage across the first diode means is dependent upon the current flow in the collector of the first output transistor. The output of the operational amplifier is applied to the base of the second output transistor.

When the first output transistor is conducting to supply the positive output load current, the voltage across the first diode means is greater than the voltage across the second diode means. Under this condition, the output of the operational amplifier is such that the second output transistor is not conducting above its threshold of conduction. For a negative output load current, the voltage across the first diode means is less than the voltage across the second diode means. The output of the operational amplifier is then sufficient to turn on the second output transistor such that it is conducting to supply the negative output load current. When the second output transistor is supplying the load current, the first output transistor is conducting at its quiescent current level. The operational amplifier thus drives the second output transistor such that the collector current of the first output transistor never drops substantially below its quiescent current level. As a result, the frequency response of the circuit of the present invention is determined by a simple emitter-follower (the input signal is applied to the base of the first output transistor wherein its emitter voltage tends to track its base voltage) rather than the more complex loop involving the operational amplifier and the second output transistor.

Figure 2:
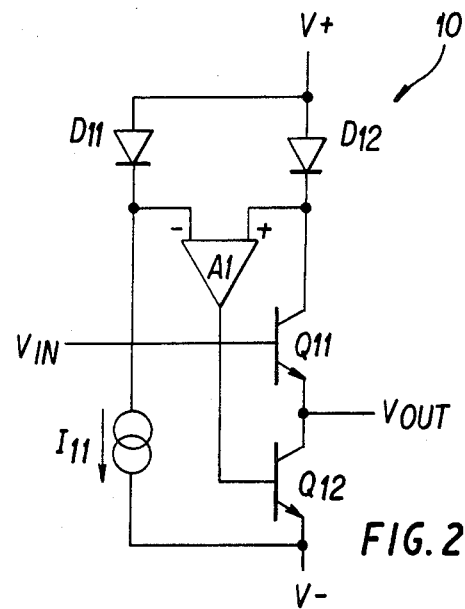
Figure 3:
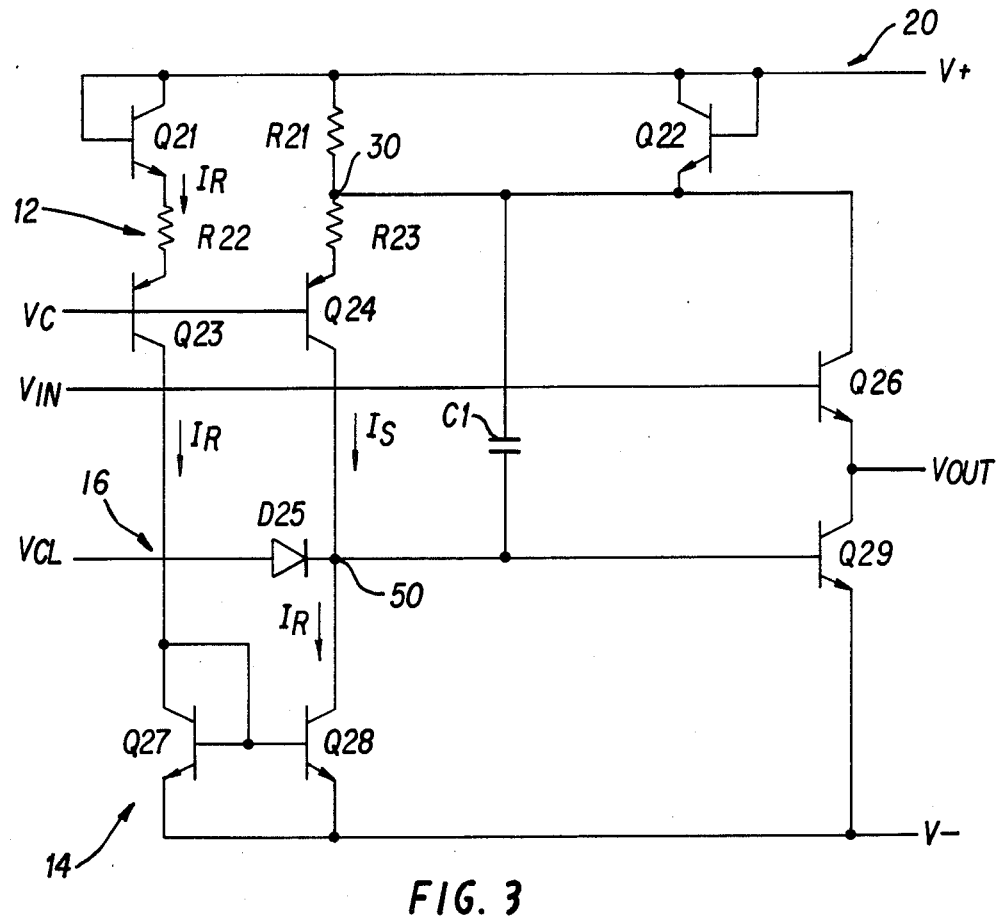
Figure 4:
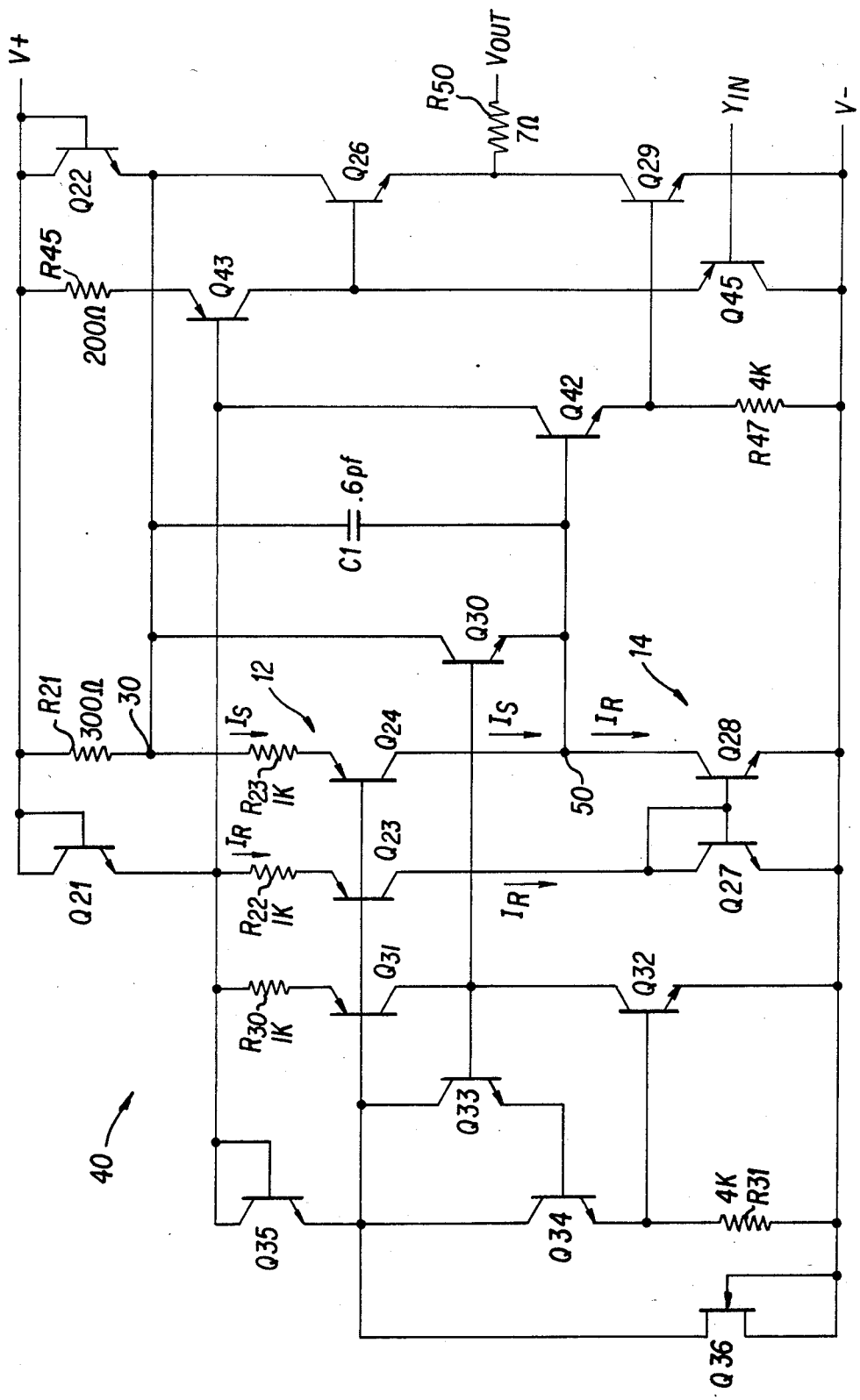
Figure 5:
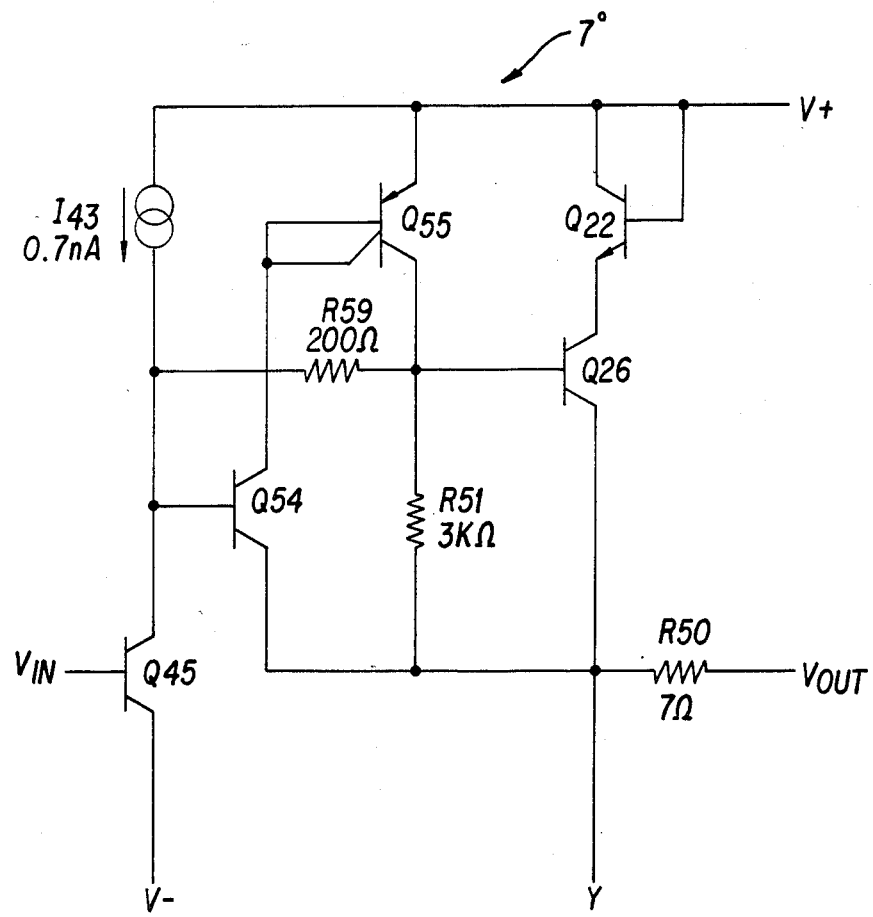

The circuit arrangement disclosed is described in more detail hereinafter in conjunction with the drawings wherein:

FIG. 1 schematically illustrates an output stage arrangement representative of the prior art;

FIG. 2 schematically illustrates an output stage arrangement in accordance with the present invention;

FIG. 3 schematically illustrates, in greater detail, an output stage arrangement in accordance with the present invention;

FIG. 4 schematically illustrates a further developed output stage arrangement in accordance with the present invention; and FIG. 5 schematically illustrates a boost circuit which may be utilized in the output stage arrangement of the present invention.

Having previously described the prior art scheme illustrated in FIG. 1, attention is now directed to FIG. 2 which illustrates the circuit design in accordance with the present invention. This circuit design, which is generally indicated by the reference numeral 10, is specifically adapted to eliminate the problems heretofore discussed. Circuit 10 may comprise an amplifier output stage for a previous stage or stages of a larger integrated circuit, which is not shown. Circuit 10 is especially adapted for use as a class AB output stage. As is known, a class AB output stage operates as class A for small signals and as class B for large signals.

In integrated circuit format, output stage 10 preferably includes NPN power amplifier transistors Q11 and Q12. For circuits utilizing discrete components, the power amplifier transistors may alternatively be PNP transistors. The input voltage $V_{in}$ is applied at the base of transistor Q11, and the output voltage $V_{out}$ is taken from the circuit at the junction of the emitter of transistor Q11 and the collector of transistor Q12. Output transistor Q11 supplies the positive output load current, and output transistor Q12 supplies the negative output load current. Transistors Q11 and Q12 are biased such that each is conducting slightly with no input signal.

Output stage 10 further includes diodes D11 and D12. Diode D11 functions as a bias diode for establishing a reference voltage. A current source $I_{11}$ of a known value establishes a reference current that sets up the bias or reference voltage across diode D11. Diode D12 functions as a sensor diode for sensing the current flow in the collector of output transistor Q11. A conductive path is provided to connect diode D12 to the collector of output transistor Q11 and to the noninverting input ("+") of an operational amplifier A1. Another conductive path is provided to connect diode D11 to the inverting input ("−") of operational amplifier A1. The output of amplifier A1 is applied to the base of output transistor Q12.

The reference voltage across bias diode D11 is substantially equal to the voltage across sensor diode D12 when there is no input signal. The electrical characteristics of diodes D11 and D12 are closely matched so that the quiescent or no load current of transistor Q11 does not drop substantially below the value of current source $I_{11}$. Of course, the characteristics of diodes D11 and D12 may also be selected such that a substantial quiescent current could be obtained for a small value of current source $I_{11}$ where the currents are ratioed by the respective characteristics of diodes D11 and D12. Thus, in integrated circuit format, the quiescent current value of transistor Q11 is determined by current source $I_{11}$ and the area ratio of diodes D11 and D12.

Transistor Q11 is connected in circuit 10 such that it is always conducting, even with heavy loading to $V^-$. Thus, the small signal frequency response of the circuit is determined by a simple emitter-follower (the emitter voltage of transistor Q11 tends to track its base voltage), rather than the more complex, loop involving operational amplifier A1 and output transistor Q12.

In circuit 10, neither bias diode D11 nor sensor diode D12 dissipate much power so thermal runaway is not a problem. The circuit of FIG. 2 offers an added advantage in that the bias diode D11 and the control circuitry (the loop involving amplifier A1) are not tied to the input circuitry. In linear integrated circuits, this is of significant benefit for fast amplifiers, as the drive signal does not have to slew the stray capacitance associated with the control circuitry. For instance, the addition of one circuit element in the control circuitry would cut the speed of operation of a fast amplifier by approximately 50%.

A brief explanation of the operation of circuit 10 follows. A more detailed explanation of the operation of the circuit of the present invention will be provided in conjunction with the embodiment illustrated in FIG. 3.

If the load is not reactive and the input signal positive, transistor Q11 is conducting to supply the positive output load current. With transistor Q11 conducting in this manner, the voltage established across bias diode D11 by means of current source $I_{11}$ is less than the voltage across sensor diode D12, and the reference voltage at the inverting input of operational amplifier A1 is more positive than the voltage at the noninverting input. Under these conditions, the output of amplifier A1 is low, and transistor Q12 does not conduct, as a low voltage is applied at its base.

When the input signal is negative (again assuming a non-reactive load), transistor Q12 conducts to supply the negative output load current. However, due to the unique features of the circuit of the present invention, transistor Q11 also remains conducting. More particularly, when the input signal is negative, transistor Q11 tries to turn off, and the voltage across the sensor diode D12 becomes less than the bias voltage established across bias diode D11. Since transistor Q11 tries to stop conducting, the voltage at the noninverting input of amplifier A1 is more positive than the voltage at the inverting input. The output of amplifier A1 is then positive and sufficient to cause transistor Q12 to conduct. When transistor Q12 conducts, it supplies the quiescent current of transistor Q11 so that transistor Q11 remains conducting, at its quiescent current level.

The circuit 20 of FIG. 3 is a further development of the circuit of FIG. 2 wherein operational amplifier A1 includes two stages. The first stage of the operational amplifier is a differential amplifier 12 and the second stage a current mirror 14. Amplifier 12 comprises common base PNP transistors Q23 and Q24, and resistors R22 and R23. The characteristics of transistors Q23 and Q24 are closely matched. Specifically, they have the same current gain, which is approximately unity, and their respective emitters are connected to resistors R22 and R23, which have equal resistance values. The currents $I_R$ and $I_S$ flowing through resistors R22 and R23, respectively, are thus essentially equal to the respective collector currents of transistors Q23 and Q24.

A voltage source $V_c$ supplies a bias voltage ($V_c$ may be set for a drop across R22 and R23 on the order of 100 mV) to transistors Q23 and Q24. The collector of transistor Q23 is connected in circuit with the collector and base of transistor Q27 and the base of transistor Q28 of the current mirror 14. The collector of transistor Q24 is connected to the collector of transistor Q28 at a common junction 50. This junction is the output of the operational amplifier.

As noted, current mirror 14 includes NPN transistors Q27 and Q28. The characteristics of these two transistors are also closed matched. Transistors Q27 and Q28 are connected in circuit with transistors Q23 and Q24 such that the collector current $I_R$ of transistor Q23 is current-mirrored wherein this mirrored current (equal to $I_R$) flows from junction 50 into the collector of transistor Q28.

In the circuit of FIG. 3, the output transistors are the NPN transistors Q26 and Q29. Transistors Q26 and Q29 supply the positive and negative output load currents, respectively. The input voltage $V_{in}$ is applied to the base of output transistor Q26, as heretofore discussed. The sensor and bias diodes comprise NPN transistors Q22 and Q21, respectively.

Voltage source $V_c$ establishes a known reference current $I_R$ through transistor Q21. A current source means setting a minimum on transistor Q26 operating or quiescent current is implemented with resistor R21. Resistor 21 is connected between the emitter and collector of sensor diode Q22. Alternatively, the current source means may comprise a current source connected at this point to provide a fixed level of current flow.

The emitter of the bias diode is connected in circuit with amplifier 12 such that the reference current $I_R$ flowing through bias diode Q21 flows through resistor R22. The emitter of sensor diode Q22 is connected at a common junction 30 of resistors R21 and R23, and the collector of output transistor Q26. The current $I_S$ flows through resistor R23. The points at which the emitters of the sensor and bias diodes are connected to amplifier stage 12 are the noninverting and inverting inputs, respectively, of the operational amplifier (See FIG. 2).

The circuit of FIG. 3 includes additional features to improve its operation. Specifically, a feedforward capacitor C1 is connected between the collector of output transistor Q26 and the base of output transistor Q29 to provide a direct high frequency path therebetween. The capacitor is connected in circuit to charge into the base circuitry of transistor Q29 when the output load goes negative. The capacitor provides a feedforward function that by-passes the circuitry of the operational amplifier—by killing the current gain of the PNP transistors Q23 and Q24—to increase the response time of the circuit. This feedforward function is designed to increase large signal bandwidth and reduce output impedance for large positive-going output transients, especially with a relatively slow-operating operational amplifier.

Capacitor C1 stabilizes the internal control loop, which includes the amplifier stage and the current mirror. Typically above 2 MHZ, feedback is predominately through the capacitor rather than through the internal control loop. The break frequency is determined by capacitor C1 and resistor R23 and the emitter resistance of transistor Q24.

A clamp circuit 16 is also included in circuit 20. The clamp circuit in the particular embodiment illustrated comprises a voltage source $V_{CL}$ and a diode D25. The clamp circuit is utilized to enhance the response of the circuit by insuring that output transistor Q29 is not biased below its threshold of conduction. The clamp circuit establishes a precise voltage clamp level such that transistor Q29 is just at its threshold of conduction. The clamp circuit 16 therefore helps to increase the response time of circuit 20 in the transient range when the output load current swings negative.

Current source means or resistor R21 also improves the negative slew response of the circuit. With a large negative transient, transistor Q26 will tend to cut off. When this happens, resistor R21 draws stored charge from transistor Q22 and provides enough voltage swing through capacitor C1 to get transistor Q29 from its clamp level into conduction. Clamp circuit 16 and resistor R21 therefore increase the response time of the circuit for negative transients.

In operation, as heretofore discussed, output transistor Q26 remains conducting at all times. If there is no input signal, transistors Q26 and Q29 are both conducting at their quiescent current levels. That is, transistor Q26 is conducting at its quiescent current level and transistor Q29 is supplying that current.

As can be seen from FIG. 3, if the input signal $V_{in}$ is positive (assuming a non-reactive load), the output load current is the current flowing from the emitter of output transistor Q26. As the output is loaded such that the emitter current of transistor Q26 increases, the voltage across the sensor diode Q22 increases and becomes larger than the voltage across the reference diode Q21, which is fixed. The voltage across resistor R21 increases with an increase in the voltage across the sensor diode Q22, resulting in a drop in the voltage across resistor R23. A drop in the voltage across resistor R23 causes the current $I_S$ through resistor R23 to decrease. The reference current $I_R$ flowing from the emitter of reference diode Q21 and through resistor R22 (a first input of the operational amplifier) is then greater than the current $I_S$ flowing through resistor 23 (a second input of the operational amplifier).

As discussed, the current $I_R$ from the collector of transistor Q23 is mirrored by current mirror 14 and appears at junction 50 as illustrated. The current $I_S$, which is dependent on the current sensed by sensor transistor Q22, also appears at junction 50 with the result that the current sensed by the sensor transistor is in effect compared to the reference current. Since the current $I_R$ leaving junction 50 is greater than the current $I_S$ entering junction 50, the only input to output transistor Q29 is that provided by the clamp circuit 16. As noted, the clamp circuit establishes a bias voltage at the base of output transistor Q29 such that this transistor is just at its threshold of conduction. Transistor Q29 is therefore effectively turned off when the output load current is positive.

If the input signal $V_{in}$ is negative (again assuming a non-reactive load), output transistor Q26 tries to stop conducting since a negative voltage is applied at its base. However, transistor Q26 remains conducting and output transistor Q29 drives the load negative, as will now be discussed. When the input signal swings negative, the voltage across the sensor diode Q22 decreases with respect to the voltage across the bias diode Q21, since current flowing in the collector of transistor Q26 decreases. The voltage across resistor R21 decreases with the drop in voltage across sensor diode Q22, resulting in an increase in the voltage across resistor R23 and an increase in the current $I_S$ therethrough. The current $I_S$ is then greater than current $I_R$.

As noted, current $I_R$ is current-mirrored and flows from junction 50 into the collector of transistor Q28 of the current mirror. At junction 50, the reference current and the current sensed by the sensor diode may be thought of as being compared to produce the appropriate output. Where the current $I_S$ entering junction 50 is greater than the current $I_R$ leaving junction 50, the output is an excess current that is delivered to the base of output transistor Q29, causing that transistor to conduct and drive the load negative. As discussed, the clamp circuit has established a precise clamp level at the threshold of conduction of transistor Q29 with a positive output load. When transistor Q29 is on and driving the output load negative, the clamp circuit may be considered to be de-activated.

As noted, when the output current is negative, output transistor Q26 remains conducting. This occurs because when transistor Q29 is turned on it supplies the quiescent current of transistor Q26, as the input is applied to the base of transistor Q26 and the output is taken from the junction of the emitter of transistor Q26 and the collector of transistor Q29. The frequency response of the circuit of the present invention is, therefore, determined by a simple emitter-follower, even when transistor Q29 is supplying the load current.

As discussed, the amplifier 12 and current mirror 14 may be by-passed by means of capacitor C1. Capacitor C1 may discharge into the base of transistor Q29 when the output load goes negative, to thereby increase the response time of the circuit.

Another version of the output circuit design of the present invention is illustrated in FIG. 4. In FIG. 4, like components are referred to by the reference numerals utilized in FIG. 3. Thus, the circuit, which is represented generally by reference numeral 40, of FIG. 4 includes power output transistors Q26 and Q29, bias and sensor diodes Q21 and Q22, respectively, amplifier 12, current mirror 14, and capacitor C1.

In circuit 40, the clamp circuit utilizes an NPN transistor Q30 in place of the diode D25 of FIG. 3. The circuit elements connected in circuit with the base of transistor Q30 are provided to establish the clamp voltage ($V_{CL}$ in FIG. 3) of the clamp circuit and the bias voltage ($V_c$ in FIG. 3) for transistors Q23 and Q24 of amplifier 12. These elements include transistors Q31 through Q36, and resistors R30 and R31.

Briefly, start-up biasing is accomplished with collector field effect transistor Q36. Once in operation, the collector current of transistor Q34 is added to the drain current of transistor Q36 to bias transistor Q35. These currents plus the current through transistors Q23 and Q31 flow through transistor Q21 to set the quiescent current of transistor Q26, along with resistor R21.

The biasing circuitry for the clamp includes transistors Q31 through Q34. This circuitry is arranged such that emitter current of transistor Q30 is approximately equal to the base current of NPN transistor Q42 with no load.

Transistor Q42 is included in circuit 40 for amplifying the current flowing into the base of output transistor Q29. The current that is amplified is that provided by the clamp circuit or that flowing from junction 50 when the output current is negative, as heretofore described. The circuit is thus able to operate at a lower current level. The resistor R47 establishes the minimum operating current through transistor Q42.

The input voltage $V_{in}$ is applied to the base of output transistor Q26 through PNP transistor Q45. Transistor Q45 functions as a level shifter for approximately equalizing the output voltage $V_{out}$ and the input voltage $V_{in}$.

Circuit 40 further includes a transistor Q43 and resistor R45 which form a current source to bias transistors Q45 and Q26. A resistor R50 is also provided to isolate the internal control loop of circuit 40 from any capacitive and resonant loading. Resistor R50 limits the phase lag that can be induced at the emitter of transistor Q26. The values of the various resistors and of capacitor C1 of circuit 40 are shown in FIG. 4.

The circuit of FIG. 4 may be modified by the addition of a boost circuit 70 illustrated in FIG. 5 wherein like components in FIGS. 4 and 5 are referred to by the same reference numerals. Boost circuit 70 reduces the standby current of the circuit of FIG. 4 by at least a factor of three while improving performance. Particularly, the boost circuit raises effective current gain and transconductance of output transistor Q26, while reducing standby current and output resistance.

It does this by increasing the effective current gain of Q26 so that the current source ($I_{C43}$) can be drastically cut. Secondly, it can give under 0.5 ohms follower output resistance at less than 3 mA bias, something that normally takes over 40 mA. The boost circuit does not degrade the high frequency response of circuit 40.

If resistor R59 is removed (opened), circuit operation becomes clearer. Output resistance is determined by transistor Q54, with transistors Q55 and Q26 providing current gain. If the current through resistor R51 is larger than the base current of transistor Q26, output resistance is proportionately reduced. Without resistor R51, output resistance depends on transistor Q26 bias like a simple follower.

The purpose of resistor R59 is to provide a direct ac path at high frequencies and kill unneeded gain in the boost feedback loop. If resistor R51 is properly selected, voltage change across resistor R59 with loading is less than 40 mV so a small value causes no problem (increasing load does cause transistor Q45 bias current to increase.) In integrated circuit format, the quiescent drop across resistor R59 is set by sizing transistors Q54, Q55 and Q26 geometries.

It should be understood that the circuits of the present invention heretofore described may include other components. Such components, however, have not been described, as they may readily be provided.

Although certain specific embodiments of the invention have been described herein in detail, the invention is not to be limited to only such embodiments, but rather only by the appended claims.

What is claimed is:

1. A circuit output stage, comprising:
    a first output transistor wherein an input to the circuit is to be applied to the base of said first output transistor;
    a second output transistor having its collector connected to the emitter of said first output transistor wherein an output from the circuit is to be taken from the junction of said collector and emitter;
    a first diode means for sensing the current flow in the collector of said first output transistor; and
    a circuit means for establishing a quiescent operating current level of said first output transistor and said circuit means having an output that is to be applied to the base of said second output transistor for preventing the output of said first output transistor from falling substantially below said quiescent operating current level wherein the output of said circuit means is dependent upon the current sensed by said first diode means.

2. The circuit of claim 1 further including a capacitor means connected in circuit with the collector of said first output transistor and the base circuitry of said second output transistor for providing a direct signal path therebetween.

3. The circuit of claim 2 further including a current source means and a clamp circuit means for increasing the negative slew response of the circuit.

4. The circuit of claim 3 further including a second diode means for establishing a reference voltage based upon a predetermined reference current wherein said circuit means compares the reference current to the current sensed by said first diode means to produce the output of said circuit means.

5. The circuit of claims 1 or 4 wherein said first and second output transistors are NPN transistors.

6. A circuit, comprising:
    a first output transistor means for supplying a positive output load current wherein an input to the circuit is to be applied to the base of said first output transistor means;
    a second output transistor means for supplying a negative output load current having its collector connected with the emitter of said first output transistor means wherein an output from the circuit is to be taken from the junction of said collector and emitter;
    a first diode means connected with the collector of said first output transistor means for sensing the current flow therein;
    a circuit means connected with said first diode means and the base of said second output transistor means for establishing a quiescent current level for said first output transistor means; and
    said circuit means having an output that is dependent upon the current sensed by said first diode means wherein the output is to be applied at the base of said second output transistor means to cause said second output transistor means to supply the negative output load current and to prevent the output of said first output transistor means from falling substantially below said quiescent current level.

7. The circuit of claim 6 further including a feedforward capacitor connected in circuit with the collector of said first output transistor means and the base circuitry of said second output transistor means for providing a direct signal path therebetween.

8. The circuit of claims 6 or 7 further including a clamp and a current source means for increasing the response time of the circuit when the output load current goes negative.

9. The circuit of claim 8 further including a second diode means for establishing a reference voltage wherein said circuit means compares the reference voltage to a voltage across said first diode means to produce the output of said circuit means.

10. The circuit of claim 9 further including a boost circuit means for reducing the output impedance of the circuit.

11. The circuit of claim 6 further including a resistor means connected at the output of the circuit for limiting the phase lag that can be induced at the emitter of said first output transistor.

12. The circuit of claim 6 wherein said first and second output transistors means are NPN transistors.

13. A circuit output stage, comprising:
    a first output transistor wherein an input to the circuit is applied at the base of said first output transistor;
    a second output transistor having its collector connected with the emitter of said first output transistor wherein an output from the circuit is taken from the junction of said collector and emitter;
    a sensor diode means for sensing the current flow in the collector of said first output transistor;
    a reference diode means for establishing a reference voltage;
    a circuit means for establishing a quiescent current level of said first output transistor; and
    said circuit means having an output that is a function of said reference voltage and a voltage across said sensor diode means wherein said output is applied to the base of said second output transistor to cause said second output transistor to supply a negative output load current and to prevent the output of said first output transistor from dropping substantially below its quiescent current level.

14. The circuit of claim 13 further including a capacitor means connected in circuit with the collector of said first output transistor and the base circuitry of said second output transistor for providing a direct signal path therebetween wherein said capacitor means is connected in circuit to discharge into the base circuitry of said second output transistor when the output load current goes negative.

15. The circuit of claim 14 further including a current source means and a clamp circuit means for allowing slewing in the negative direction to take place more rapidly.

16. A circuit output stage arrangement, comprising: p1 a first output transistor for supplying a positive output load current wherein an input signal is applied to the base of said first output transistor;
- a second output transistor for supplying a negative output load current having its collector connected to the emitter of said first output transistor wherein an output from the circuit is taken from the junction of said collector and emitter;
- a first diode means connected with the collector of said first output transistor for sensing the current flow in the collector;
- a second diode means for establishing a reference voltage from a known reference current;
- a circuit means for establishing the quiescent current of said first output transistor; and
- said circuit means having an output that is a function of said reference current and the current sensed by said first diode means wherein said output is applied to the base of said second output transistor to cause said second output transistor to supply the negative output load current and to prevent the output of said first output transistor from dropping substantially below said quiescent current level.

17. The circuit of claim 16 further including a capacitor connected in circuit with the collector of said first output transistor and the base circuitry of said second output transistor for providing a direct signal path therebetween wherein said capacitor is connected in circuit to charge into the base circuitry of said second output transistor when the output load current goes negative.

18. The circuit stage of claim 17 further including a clamp and a current source means to allow slewing in the negative direction to take place rapidly.

19. The circuit stage of claim 18 wherein said first and second output transistors are NPN transistors.

20. The circuit stage of claims 16 or 19 wherein said circuit means includes an operational amplifier.

21. The circuit stage of claim 20 wherein said operational amplifier has a first input connected in circuit with said second diode means for the flow of said reference current thereinto, a second input connected in circuit with said first diode means for the flow of a current thereinto, and an output connected in circuit with the base of said second output transistor to form a first common junction.

22. The circuit stage of claim 21 wherein said operational amplifier includes a current mirror having an output connected to said first junction.

23. The circuit stage of claim 22 wherein said reference current flowing into said first input is current mirrored by said current mirror so that the amount of current flowing into said current mirror is a constant ratio of the current flowing from said first junction.

24. The circuit stage of claim 23 wherein the current flowing into said second input flows into said first junction.

25. The circuit stage of claim 24 wherein when the output load current is positive the current leaving said first junction and flowing into said current mirror is greater than the current entering said first junction from said second input with the result that said second output transistor is not conducting above its threshold of conduction.

26. The circuit stage of claim 25 wherein when the output load current swings negative the current entering said first junction from said second input is greater than the current leaving said first junction and flowing into said current mirror with the result that said second output transistor is caused to conduct to supply the negative output load current while said first output transistor is conducting at its quiescent current level.

27. The circuit stage of claim 26 further including a transistor means for amplifying the current flowing from said first junction into the base of said second output transistor.

28. The circuit stage of claim 16 further including a level shifter means through which the input signal is applied to the base of said first output transistor for substantially equalizing the input and output voltages of the circuit.

29. The circuit stage of claim 16 further including a boost circuit means for reducing the output impedance of said first output transistor.

* * * * *

UNITED STATES PATENT AND TRADEMARK OFFICE
CERTIFICATE OF CORRECTION

PATENT NO. : 4,573,021
DATED : Feb. 25, 1986
INVENTOR(S) : Robert J. Widlar

It is certified that error appears in the above-identified patent and that said Letters Patent is hereby corrected as shown below:

Column 11, line 6, Claim 16, delete "pl".

Signed and Sealed this

Twenty-third Day of September 1986

[SEAL]

Attest:

DONALD J. QUIGG

Attesting Officer

Commissioner of Patents and Trademarks